United States Patent [19]

Falke

[11] 3,868,598

[45] Feb. 25, 1975

[54] COMBINED POTENTIOMETER AND AMPLIFIER CIRCUITRY

[75] Inventor: Reinhard Falke, Boblingen, Germany

[73] Assignee: Hewlett-Packard GmbH, Boblingen, Germany

[22] Filed: May 3, 1974

[21] Appl. No.: 466,761

[30] Foreign Application Priority Data

June 7, 1973 Germany .......................... 2329026

[52] U.S. Cl. ................................ 330/130, 338/137
[51] Int. Cl. ............................................ H03g 3/22
[58] Field of Search ............ 338/137; 330/129, 130, 330/133, 134; 179/1 G; 178/DIG. 6

[56] References Cited

FOREIGN PATENTS OR APPLICATIONS 479,936 2/1938 Great Britain ..................... 330/134

*Primary Examiner*—James B. Mullins
*Attorney, Agent, or Firm*—A. C. Smith

[57] ABSTRACT

A combined potentiometer and amplifier circuitry contains a gain controlled amplifier having its gain control input connected to a potentiometer circuit via a subtraction network. The potentiometer circuit is provided with two slidable tapping elements linked to separate actuating members and with a movable frame which limits the relative maximum distance the two actuating members can have at the same time. Thereby the dynamic range of the potentiometer output and thus of the gain controlled amplifier can be adjusted. Furthermore, a DC offset signal is derived from the output signals of the potentiometer and is combined with the output signal of the gain controlled amplifier to obtain a composed output signal the waveform whereof has a constant rise time and is not distorted relative to the waveform at the input of the gain controlled amplifier.

5 Claims, 4 Drawing Figures

$T_1 = T_1^*$ $A = V_u - V_L$ $V_0 = \frac{1}{2} \cdot (V_u + V_L)$

COMBINED POTENTIOMETER AND AMPLIFIER CIRCUITRY

BACKGROUND OF THE INVENTION

It is well-known with impulse amplifiers to use two separate potentiometer circuits in order to adjust either the amplitude and the base line of the output signal or to adjust directly the extreme values of the output signal. As the used amplifiers are only linear in a limited range, it can happen that by the adjustment of the one extreme value relative to the other extreme value the linear amplification range is exceeded. Thus, the user would be left in error as to the actually adjusted extreme values.

SUMMARY OF THE INVENTION

It is the major object of this invention to provide a circuitry which allows a separate adjustment of the extreme values of the waveform to be delivered by an amplifier circuit without introducing operating mistakes as the limited linear range of any component of the related circuitry is exceeded.

According to this invention this problem is solved by a circuitry for adjusting the level between two output signals of a potentiometer, including a resistive body, two tapping elements each slidably mounted and conductively connected to a different point of the resistive body, actuating members mechanically connected to each of these tapping elements, a frame with a slot arranged to limit the distance between extreme positions each of the actuating members can have at a time, and another frame which surrounds both actuating members and is movable together with them to limit the variable actual distance between these actuating members to a selected value which determines the maximum possible level between the two output signals of the potentiometer. This circuitry includes two conductors extending in spaced relationship to the resistive body and being electrically insulated therefrom, where each of the tapping elements is conductively coupled to one of these conductors. There is provided a gain controlled amplifier circuit having a gain control input connected to receive a control signal derived from the two potentiometer output signals being adjustable by means of the actuating members. Furthermore, there is provided a subtraction network connected to receive the adjusted potentiometer output signals and to supply a gain control signal to the gain control input which signal is proportional to the difference between the two potentiometer output signals as adjusted by means of the two actuating members, a summation network connected to receive these potentiometer output signals and to supply an offset signal which is proportional to their sum, an auxiliary amplifier connected to receive these offset signals and a second summation network connected to receive an output signal of the gain controlled amplifier as well as the offset signal to supply an amplifier output signal of the circuitry having a waveform which at a different scale corresponds to the waveform of the signal appearing at the input of the gain controlled amlifier which output waveform has a constant rise time as well as upper and lower extreme values adjusted according to the positions of the actuating members. Hereby the possible maximum value or the possible minimum of the signal waveform can be individually adjusted without exceeding the linear range of amplitudes as determined by the movable frame. This provides a mechanical interlock that prevents an erroneous operation beyond the given linearity range.

Of course, relative translatory or rotary movements of suitably shaped operating elements and potentiometer components can be used, provided these operating elements and components are mechanically interlocked in the described novel manner.

Generally the upper and lower extreme values of the output signals of amplifiers with arbitrary input signals can be adjusted to predetermined values without distorting the waveforms at the output with regard to the waveform at the amplifier input. This is, of course, only true on condition that the input signal does not yet exceed the linear operating range of the amplifier. If the input signal is symmetrical relative to the operating point in the "A"-type operation of the amplifier, the output amplitude can be adjusted to be equal to the total linear range of the amplifier circuit.

In case the linear range of the amplifier is sufficient, one may renounce on the mechanical interlock which would limit the amplitude of the output signal.

Figure 2:
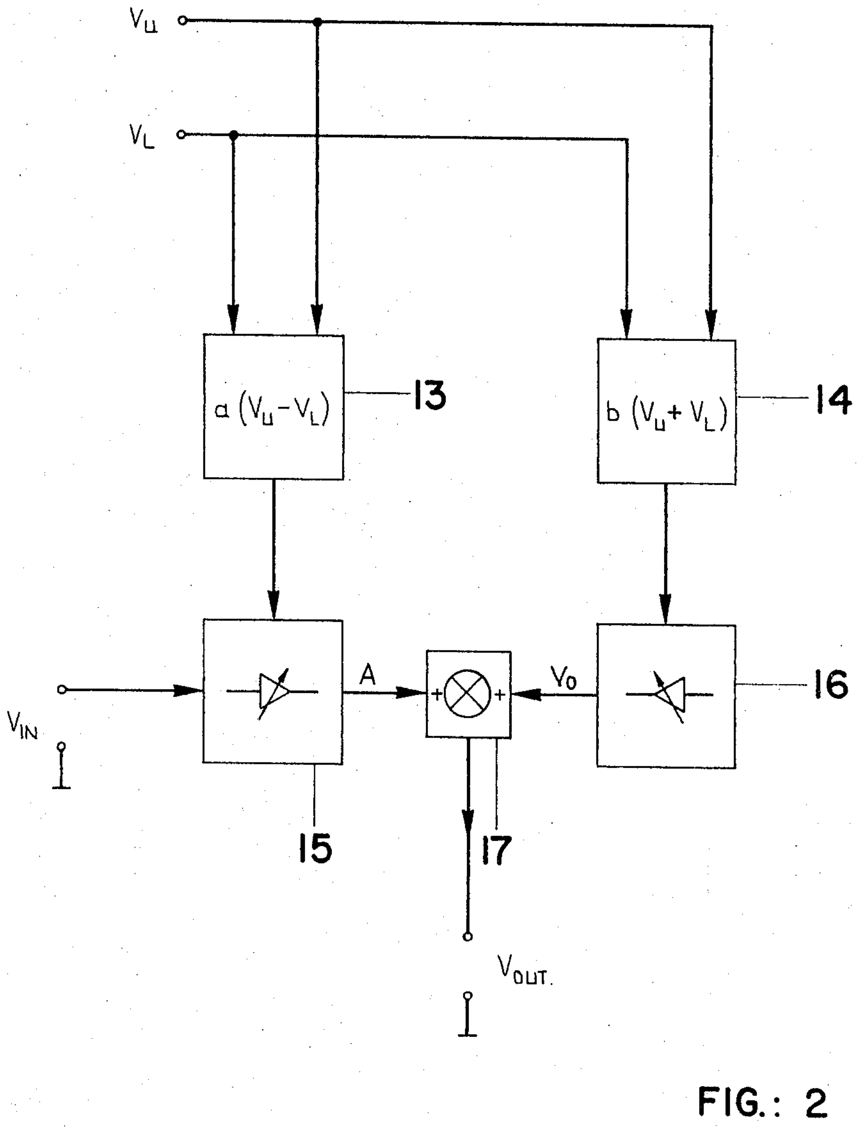
FIG. 2 shows a block diagram of a circuit which cooperates with the potentiometer circuit in order to change the amplitude of a signal without modifying its waveform.

FIG. *3a, b* shows diagrams of signal waveforms occuring in the circuit of FIG. 2.

DESCRIPTION OF THE PREFERRED EMBODIMENT

Figure 1:
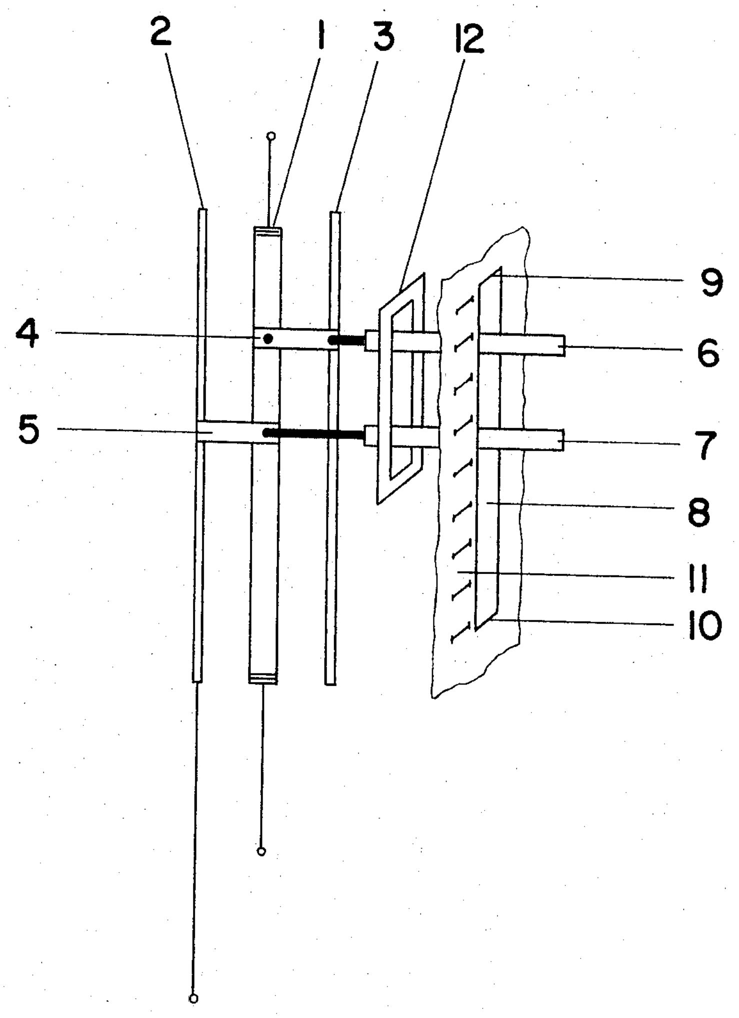
FIG. 1 shows an exploded view of a potentiometer circuit.

FIG. 1 schematically represents the major parts of the potentiometer circuit:

An extended resistive body 1 of a potentiometer is connected to a not-represented voltage source and is parallel to two conductors 2 and 3. Each of these conductors is connected to the resistive body 1 via a separate sliding wiper or tapping element 4 or 5. Each of the tapping elements 4 or 5 is connected to an actuating member 6 or 7 which extends through a longitudinal slot of a frame which forms a part of the housing of a signal source or amplifier. The longitudinal slot provides upper and lower abutments 9 or 10 which limit the movement of the actuating elements and is laterally provided with a scale 11.

Both actuating members 6 or 7 are surrounded by a movable frame 12 which limits the relative distance between both actuating elements to the direction of movement to make sure that the difference in the potentials between both tapping elements does not exceed a given value.

This embodiment could, for example be modified in that instead of a translatory movement of rotary movement may be provided. In this case the potentiometer and its frames may be of circular shape. Furthermore, the conductors 2 and 3 could be omitted if the remaining circuitry were directly connected to the tapping elements.

FIG. 2 shows a block diagram of a circuit by which an input signal can be attenuated or amplified such that its extreme values correspond to the positions of the actuating members without distorting the waveform.

The connectors 2 and 3 on the one hand are connected to a subtraction network 13 and on the other hand are connected to a summation network 14. In the subtraction network a control voltage for a linear gain controlled amplifier 15 is derived which is proportional to the difference in potential of the tapping elements 5 and 6. In the summation network 14 a voltage is derived for application to an auxiliary amplifier 16, which voltage is proportional to the sum of the potentials at both tapping elements. Both amplifiers are connected to an output summation network 17 which produces the signal $V_{out}$ as the sum of the signals A and $V_o$ applied thereto by the amplifiers 15 and 16, respectively.

Figure 3A:
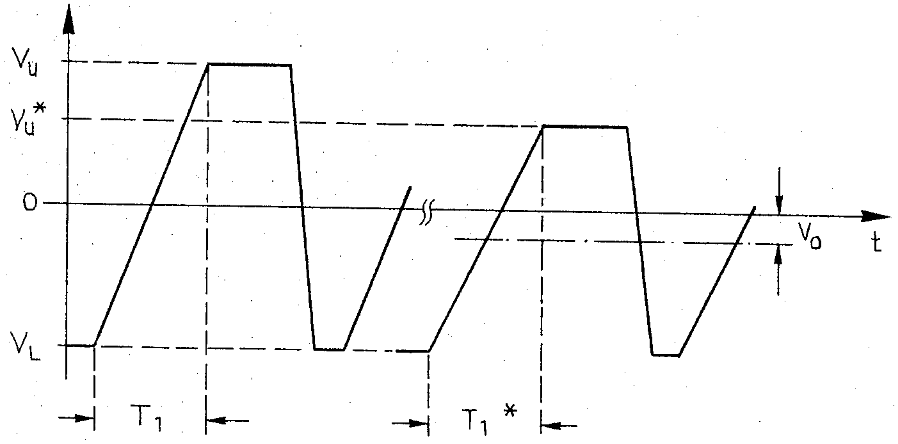

The operation of the circuitry of FIG. 2 in connection with the potentiometer circuit of FIG. 1 is illustrated with reference to FIGS. 3*a* and 3*b*. The trapezoidal input voltage of FIG. 3*a* has a rise time T1. In this embodiment merely the upper voltage level $V_u$ was decreased to the voltage level $V_u$*, while the lower voltage level $V_L$ remained unchanged. The amplitude of the attenuated output signal is determined from the difference of the potentials $V_u$ and $V_L$ at the tapping elements 4 or 5 and is adjusted by the linear amplifier 15. The amount of shift $V_o$ of the base line and thus the absolute position of the new potential level equals half the sum of the extreme values $V_u$ and $V_L$. Thus, an independent adjustment of the upper and lower extreme values of the trapezoidal impulse is obtained and the amplitude does not exceed a given value determined by the linearity range of the linear control amplifier and the waveform is not distorted.

Figure 3B:
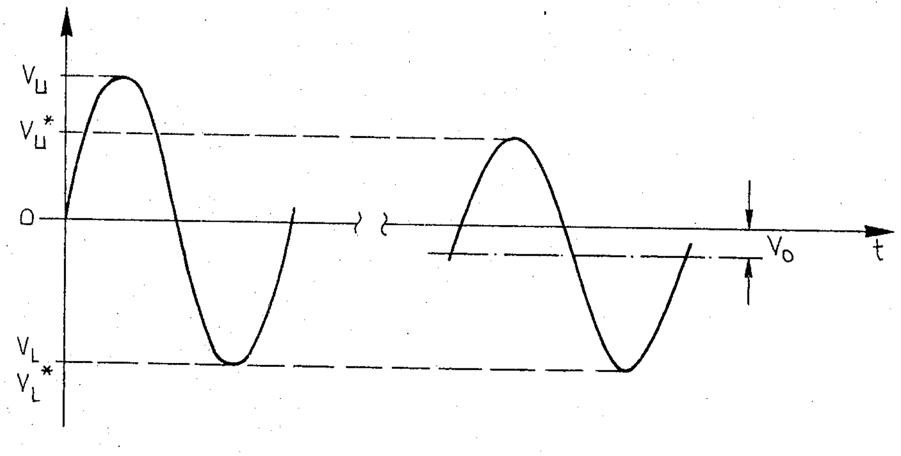

In a similar manner, the sinusoidal waveform of FIG. 3*b* is preserved after amplification. Likewise, the time interval T1 until arrival at the maximum value remains constant disregarding the value to which the maximum value has been increased or decreased in relation to the input signal.

I claim:

1. Circuitry for adjusting the level between two output signals of a potentiometer, including a resistive body, two tapping elements each slidably mounted and conductively connectable to different points on the resistive body, actuating members mechanically connected to each of the tapping elements, limiter means disposed to limit the distance between extreme positions of each of the actuating members can have at a time, auxiliary limiter means disposed with respect to both actuating members and movable therewith to limit the variable actual distance between these actuating members to a selected value which determines the maximum possible level between the two output signals of the potentiometer.

2. Circuitry as in claim 1, including two conductors extending in spaced relationship to the resistive body and being electrically insulated therefrom, where each of the tapping elements is conductively coupled to one of these conductors.

3. Circuitry as in claim 1, including a gain controlled amplifier circuit having a signal input and a gain control input, circuit means connected to apply to the gain control input a control signal derived from the two potentiometer output signals for altering the amplification of applied signal in response to the position settings of the actuating members.

4. Circuitry as in claim 3, wherein said circuit means includes a subtraction network connected to receive the adjusted potentiometer output signals and to supply to the gain control input a gain control signal which is proportional to the difference between the two potentiometer output signals as adjusted by means of the two actuating members, and comprising a summation network connected to receive these potentiometer output signals for producing an offset signal which is proportional to their sum, network means connected to receive an output signal of the gain controlled amplifier as well as the offset signal for producing the output signal of the circuitry having a waveform which, at a difference scale, corresponds to the waveform of an applied signal appearing at the input of the gain controlled amplifier which output waveform has a rise time interval substantially equal to the rise time interval of the applied signal and has upper and lower extreme values adjusted according to the positions of the actuating members.

5. Signal translating circuitry comprising:

a gain controlled amplifier circuit having a gain control input and another input for receiving an applied signal;

a subtraction network connected to receive two signals which determine the selected upper and lower output levels of the gain controlled amplifier, said subtraction network being connected to apply to the gain control input a gain control signal which is proportional to the difference between these two signals which determine the selected upper and lower output levels, a summation network like wise connected to receive these two signals which determine the selected upper and lower output levels for producing an offset signal which is proportional to their sum, and circuit means connected to receive an output signal of the gain controlled amplifier as well as the offset signal for producing an amplified output signal of a waveform which, at a different scale, corresponds to the waveform of the applied signal at the input of the gain controlled amplifier and has a rise time interval substantially equal to the rise time interval of the applied signal and has upper and lower extreme values adjusted according to the two signals which determine the selected upper and lower output levels and which are applied to the subtraction and summation networks, respectively.

* * * * *

UNITED STATES PATENT OFFICE

CERTIFICATE OF CORRECTION

Patent No. 3,868,598 Dated February 25, 1975

Inventor(s) Reinhard Falke

It is certified that error appears in the above-identified patent and that said Letters Patent are hereby corrected as shown below:

Column 2, line 58, after "movement", "of" should read -- a --;

Column 4, line 21, "ference" should read -- ferent --.

Signed and sealed this 17th day of June 1975.

(SEAL)
Attest:

RUTH C. MASON
Attesting Officer

C. MARSHALL DANN
Commissioner of Patents and Trademarks